United States Patent [19]

Ahlemeyer et al.

[11] Patent Number: 4,888,815
[45] Date of Patent: Dec. 19, 1989

[54] SCANNING RADIO RECEIVER

[75] Inventors: William B. Ahlemeyer, Indianapolis; Ben F. McCormick, II, Noblesville; Stephen T. Crum, Indianapolis, all of Ind.

[73] Assignee: Uniden America Corporation, Ft. Worth, Tex.

[21] Appl. No.: 98,285

[22] Filed: Sep. 18, 1987

Related U.S. Application Data

[60] Continuation of Ser. No. 020,785, , abandoned, which is a division of Ser. No. 884,278, Jul. 10, 1986, abandoned.

[51] Int. Cl.$^4$ .................................. H03J 7/18
[52] U.S. Cl. .................... 455/168; 455/186; 455/194; 455/212
[58] Field of Search ............... 455/161, 165, 185, 186, 455/168, 194, 154, 158, 212, 213, 218–222, 226, 166

[56] References Cited

U.S. PATENT DOCUMENTS

| | | | |
|---|---|---|---|
| 4,253,194 | 2/1981 | van Deursen | 455/161 |
| 4,385,399 | 5/1983 | Ogita | 455/158 |
| 4,392,246 | 7/1983 | Niioka et al. | 455/158 |
| 4,392,247 | 7/1983 | van Deursen | 455/161 |
| 4,398,304 | 8/1983 | Fathauer et al. | 455/212 |
| 4,476,582 | 10/1984 | Strauss et al. | 455/345 |
| 4,521,914 | 6/1985 | Petrovic | 455/158 |

FOREIGN PATENT DOCUMENTS 5924953  9/1985  Japan .......................... 455/158

*Primary Examiner*—Benedict V. Safourek
*Assistant Examiner*—Curtis Kuntz
*Attorney, Agent, or Firm*—Woodard, Emhardt, Naughton, Moriarty & McNett

[57] ABSTRACT

A multi-band scanning radio receiver operable without reprogramming in a plurality of geographical regions. Digital codes for public-service-band frequency allocations for each of a plurality of geographical regions are stored in a memory which is sequentially accessed to read the digital codes for the frequency allocations for a selected geographical region. A frequency synthesizer loaded with a digital code read from memory performs band switching and supplies tracking signals and a local oscillator signal to multi-band RF amplifier and mixer circuitry.

6 Claims, 3 Drawing Sheets

SCANNING RADIO RECEIVER

CROSS REFERENCE TO RELATED APPLICATION

This application is a continuation of application Ser. No. 020,785, filed Mar. 2, 1987, which is a division of application Ser. No. 884,278, filed July 10, 1986, now abandoned.

BACKGROUND OF THE INVENTION

This invention relates to scanning radio receivers, and more particularly to scanning radio receivers with frequency synthesizers.

Early scanning receivers used crystals for tuning, and the number of channels available for reception was limited by the number of crystals in a given receiver. A receiver typically contained either eight or sixteen crystals, and different crystals had to be installed to enable reception of different frequencies, including the frequencies of other desired transmissions within range of the receiver as well as, in the case or relocation or portable operation, the assigned frequencies in a different geographical region.

Modern scanning receivers generate local oscillator frequencies with a frequency synthesizer controlled by frequency codes stored in memory. Typically, the memory still contains a small number of frequency codes, but it can be programmed for operation on different frequencies. The channel capacity of scanning receivers has heretofore been limited not only because of the size, cost and complexity of memory circuitry and associated addressing circuitry, but also because of technical limitations on scanning speed. A finite amount of time is required to lock on to each frequency in the active scanning sequence, and then to detect activity on the current channel in order to determine whether or not to continue scanning.

In some applications it would be desirable to scan more than sixteen channels, and to periodically change the frequencies in the scanning sequence, without the time-consuming and inconvenient task of reprogramming memory. For example, commercial truckers commonly have reason to monitor police-band radio activity in the various geographical regions, e.g., states, in which they operate. Many states have more than sixteen channels allocated by the FCC for police use, and the frequency allocations vary from state to state. As a result of these and other factors, conventional scanning radio receivers cannot satisfactorily provide regional scanning.

SUMMARY OF THE INVENTION

The present invention provides a scanning radio receiver capable of operating without reprogramming in a plurality of geographical regions. The receiver includes a frequency synthesizer coupled to a memory in which digital codes with the public-service-band frequency allocations for each of a plurality of geographical regions are stored. Switch means are provided for selecting a geographical region, and in response to such selection a control circuit sequentially reads the digital codes for the public-service-band frequency allocations for the selected geographical region and loads the frequency synthesizer with each digital code read from memory. The receiver includes a squelch circuit which disables the receiver audio output circuit in the absence of a detected signal on any one of the frequencies to which the receiver is tuned.

It is a general object of the present invention to provide an improved scanning radio receiver.

Another object of the invention is to provide a versatile scanning receiver operable without reprogramming in a plurality of geographical regions.

These and other objects and advantages of the present invention will become more apparent upon reading the following detailed description of the preferred embodiment in conjunction with the accompanying drawings.

DESCRIPTION OF THE PREFERRED EMBODIMENT

Figure 1:
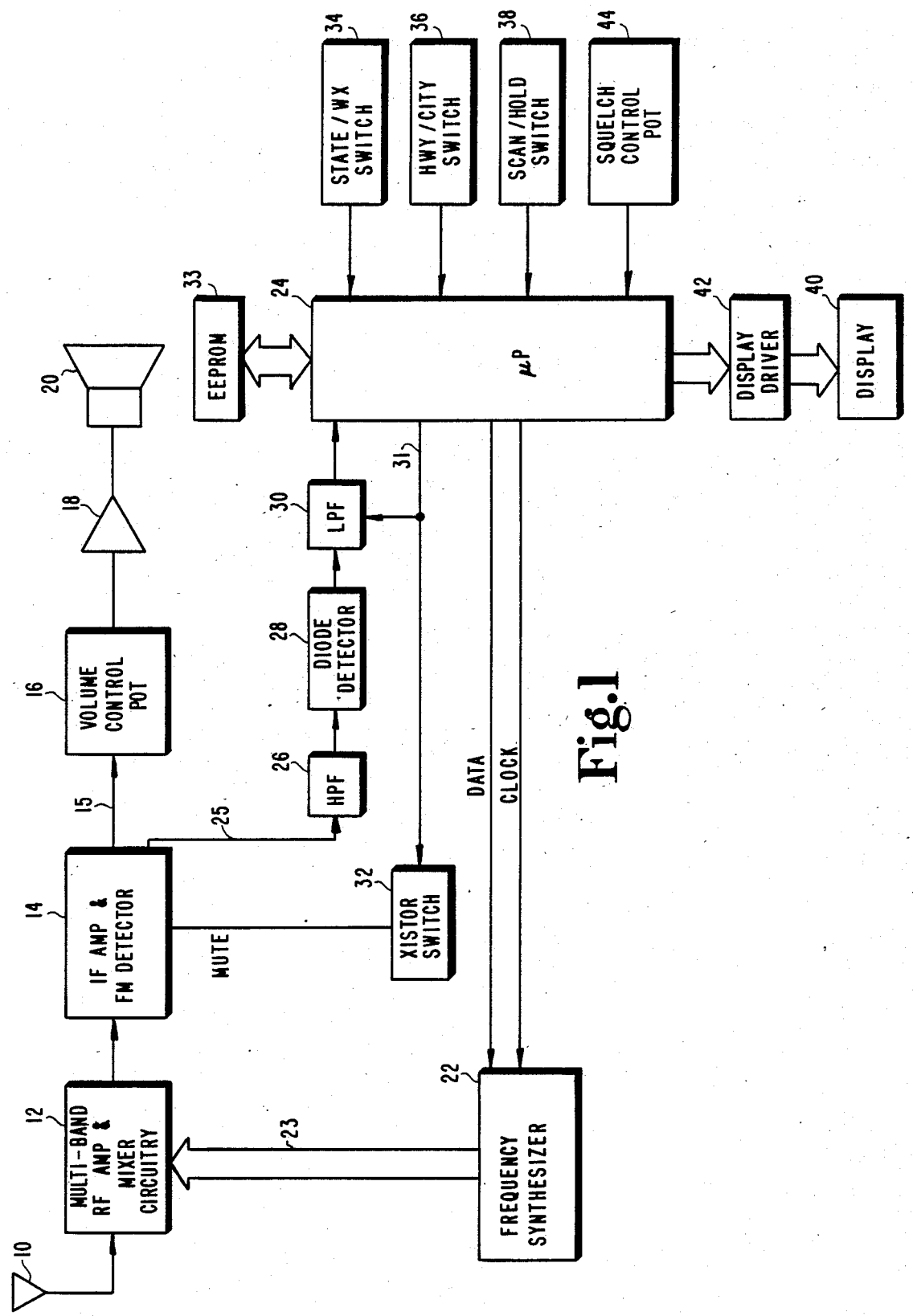
FIG. 1 is a block diagram of the preferred embodiment of the scanning radio receiver according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to FIG. 1, the preferred embodiment of a scanning radio receiver according to the present invention includes an antenna 10 coupled to a conventional superheterodyne FM receiver which includes RF amplifier and mixer circuitry 12, an IF amplifier and FM detector 14, a volume control potentiometer (pot) 16, an audio amplifier 18 and a speaker 20. The RF amplifier and mixer circuitry 12 includes individual RF amplifiers and mixers for the low and high VHF bands as well as the UHF band, as well as appropriate tracking circuits. The local oscillator signal for the receiver is generated by frequency synthesizer 22, which also supplies tracking signals to the three RF amplifiers and performs band switching as required. Multi-band RF amplifier and mixer circuitry such as that just described is well known in the art and does not require detailed description.

Frequency synthesizer 22 generates local oscillator frequencies with a conventional phase-locked loop (PLL) in which the output of a voltage-controlled oscillator (VCO) is prescaled by a dual modulus prescaler, divided in frequency by a programmable divider, and then compared in frequency and phase with the output of a reference signal, the comparator output signal being filtered and supplied to the VCO as an error signal. The PLL preferably employs a single VCO having a primary tuning coil and a second coil which is switched into a parallel connection with the primary coil for operation in the high VHF or UHF bands, with the VCO output connected to the low VHF band mixer as well as to a frequency doubler connected in cascade to a frequency tripler. The output of the frequency doubler is connected to the high VHF band mixer input, and the output of the frequency tripler is connected to the UHF band mixer input. Frequency synthesizer 22 also includes internal registers into which data is loaded from microprocessor 24 for the purpose of programming the synthesizer's programmable divider. Microprocessor 24, preferably a Motorola MC68705R3 microprocessor, supplies data serially to synthesizer 22 via the DATA line along with a clock signal on the CLOCK line. The local oscillator and control signals from frequency synthesizer 22 are supplied on lines 23 to RF amplifier and circuitry 12. Frequency synthesizer 22 preferably includes an integrated-circuit (IC) synthesizer such as the Motorola MC145156 modified to include one additional band switch output, or equivalent, and an IC prescaler such as the Motorola MC12015 dual modulus prescaler. Alternatively, the available two band switch outputs of the MC145156 may, by decoding, be used to switch up to four bands. The use of a latched synthesizer such as the MC145156 enables faster scanning through closely spaced frequencies because, in such situations, a minimal number of bits is changed for each new channel whereby PLL settling time is reduced.

IF amplifier-detector 14 includes as a primary circuit element a Motorola MC3359 integrated FM IF amplifier and detector. The output of the FM detector is continually supplied on output line 25 to high-pass filter (HPF) 26, and is selectively supplied to output line 15 under control of the signal on the MUTE input line, which is connected to internal audio mute control circuitry in IF amplifier-detector 14. The mute control circuitry grounds line 15 to disable the receiver audio output circuit. The audio output circuit may of course be disabled in other ways, such as by switching the power off to audio amplifier 18.

High-pass filter 26 is the first stage of a squelch circuit which additionally includes a diode detector 28 connected to a low-pass filter (LPF) 30 which in turn is connected to the input of an internal A/D converter in microprocessor 24. As will be described later in greater detail, microprocessor 24 analyzes the incoming signal from low-pass filter 30 and, when it is determined that no signal is present on the frequency to which the receiver is currently tuned, outputs a squelch signal on line 31 to transistor switch 32 which activates the internal audio mute control circuitry in IF amplifier-detector 14 for muting the audio.

Figure 2:
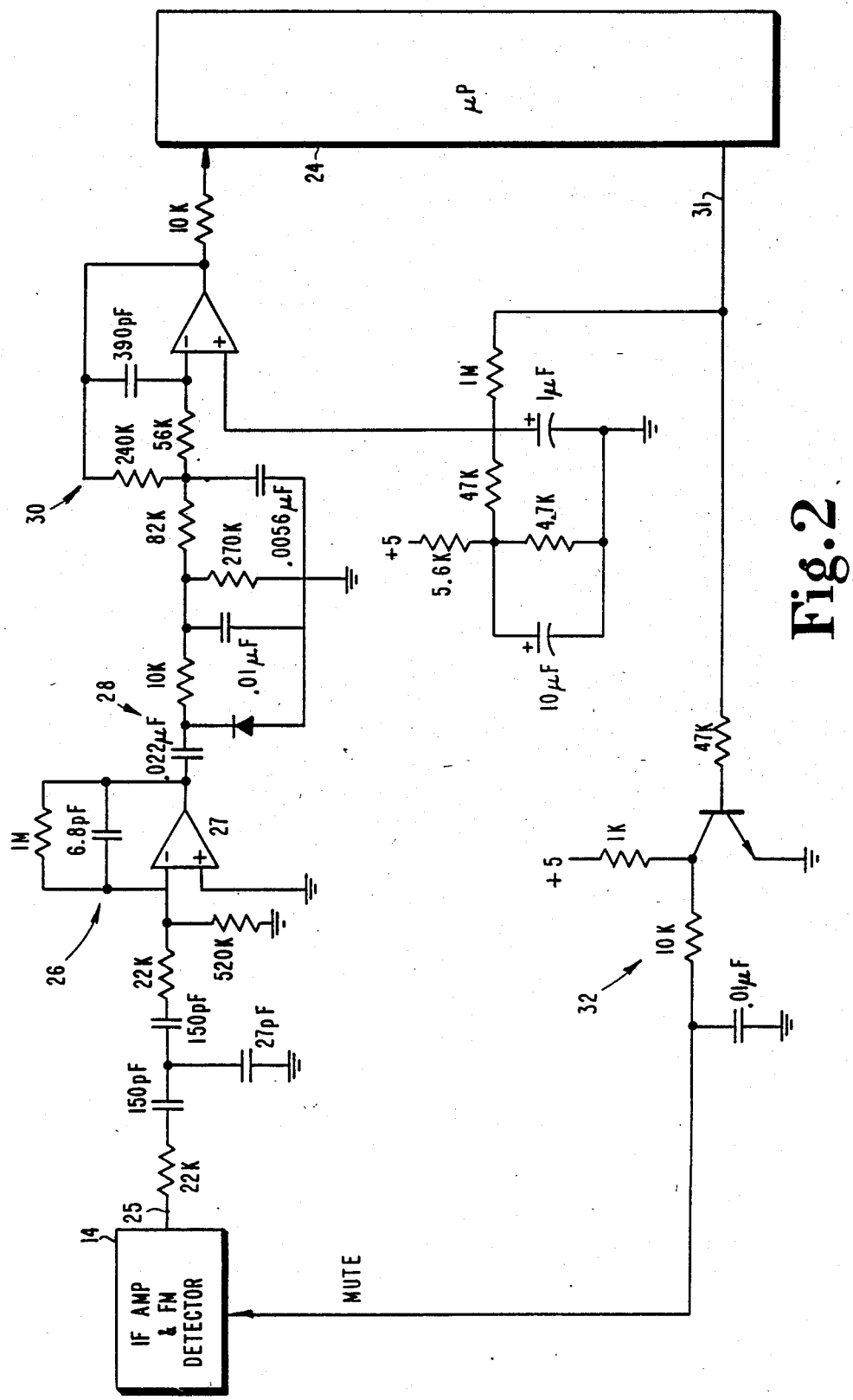
FIG. 2 is a detailed electrical schematic of a portion of the scanning radio receiver shown in FIG. 1.

FIG. 2 shows the detailed construction of filters 26 and 30 and detector 28. High-pass filter 26 is provided to attenuate voice-frequency signals relative to noise signals and thereby reduce the incidence of voice activation of the squelch which would cause premature resumption of scanning. Filtering of voice frequencies is intended to mean filtering of signals in the frequency range of approximately 1-3 Khz. In the preferred embodiment, filter 26 additionally filters out tone signals. A unity-gain, second-order Chebyshev high-pass filter with a corner frequency of 1.5 KHz has been found suitable for this purpose, and is constructed using an operational amplifier (op amp) 27 which is internal to the MC3359 IC. Diode detector 28 includes a simple RC output filter with a very small time constant, preferably 0.1 milliseconds, for greater speed in the squelch circuit and, consequently, greater scanning speed. Filter 30 is provided to attenuate higher voice and tone frequencies, and distortion due to overdeviation in the received signal, and thereby further reduce the incidence of false squelch triggering. A suitable filter for this purpose is a second-order Chebyshev low-pass filter with gain of 9.5 db and a corner frequency of 1290 Hz, as shown in FIG. 2. Hysteresis is provided in software for the squelch circuit, as will be described, and additional hysteresis is provided by the bias adjusting circuit connected to the noninverting input of the op amp of filter 30, as shown in FIG. 2. This additional hysteresis helps prevent squelch chatter in response to low signal levels near threshold.

Figures 3, 4:
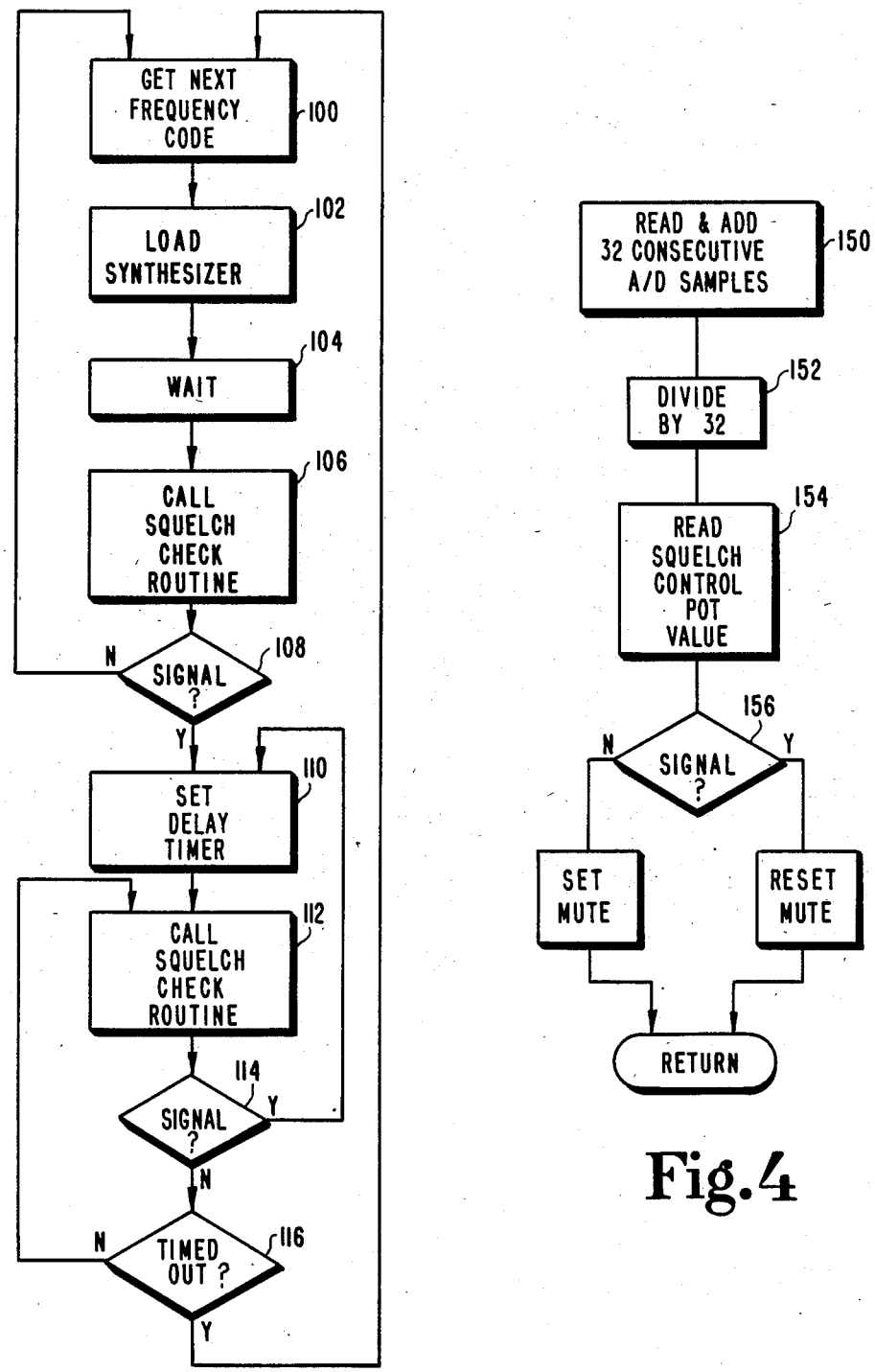
FIG. 3 is a flowchart of the scanning program executed by the microprocessor of FIG. 1.
FIG. 4 is a flowchart of the squelch check routine identified in the flowchart of FIG. 3.

Microprocessor 24 controls frequency scanning according to the program shown in the flowcharts of FIGS. 3 and 4, which program is stored in internal read-only memory (ROM) in the microprocessor. Microprocessor 24 is connected to an electrically erasable, programmable read-only memory (EEPROM) 33, preferably a National Semiconductor NMC9306, which is used for storing the current state identification code. The internal ROM in the microprocessor contains a frequency matrix including the public-service-band frequency allocations for each state in the United States, with the frequencies grouped according to (1) frequencies used by state police and highway patrols (HWY frequencies), and (2) frequencies used by local police such as city police and county sheriffs (CITY frequencies). For economy of memory usage, each state to which a particular frequency is allocated is indicated by the status of an individual bit assigned in a memory location associated with the particular frequency. The internal ROM also contains frequency codes for the weather (WX) channels allocated by the FCC. STATE/WX switch 34 is provided for selecting a particular state or for selecting weather channel scanning. HWY/CITY switch 36 enables selection between state police and local police for a selected state, and SCAN/HOLD switch 38 initiates and terminates scanning operation. Switch 34 is preferably a three-position switch with one end position for weather-band selection, a second, momentary, end position in which the microprocessor scans through internally stored state identification data, and a middle position in which, during SCAN mode, the receiver scans the frequencies for the currently selected state. Microprocessor 24 displays the currently selected state on a display 40 driven by a display driver 42. One suitable display consists of two 16-segment alphanumeric displays commercially available from Lite-On Corporation, 4951 Airport Parkway Drive, Dallas, Tex., as type LTP587, and a suitable corresponding display driver is the National Semiconductor MM5484. A number of other suitable alphanumeric displays are availabe, in light-emitting diode (LED), liquid-crystal display (LCD) and vacuum fluorescent (VF) form. The receiver additionally includes a squelch control pot 44 which is used to establish a predetermined squelch level for the receiver.

The squelch circuit will now be described in greater detail with combined reference to FIGS. 1, 3 and 4. In conjunction with the program to be described, microprocessor 24 executes certain housekeeping routines on timer interrupts. Specifically, at predetermined intervals the microprocessor checks the status of switches 34, 36 and 38 and multiplexes the display. Frequency scanning begins with SCAN mode is selected through SCAN/HOLD switch 38. In step 100, the microprocessor accesses its internal ROM to get a new frequency code for the frequency synthesizer. Codes are read from memory as a function of the position of STATE/WX switch 34 and, when switch 34 is in its middle position, the position of HWY/CITY switch 36. That is, with STATE scanning selected, when switch 36 is set for HWY scanning, all frequencies in the HWY frequency group for the currently selected state are selected for scanning, and, when switch 36 is set for CITY scanning, all frequencies in the CITY frequency group for the currently selected state are selected. When switch 34 is in the WX position, weather channels are scanned without regard to the position of switch 36.

After reading the code from memory, microprocessor 24 loads the synthesizer, in step 102, with an 18-bit serial data word and then waits approximately 23 milliseconds (step 104) before calling the squelch check routine (step 106). In the preferred embodiment the receiver operates with a scan rate of approximately 40 channels per second, which corresponds to a scan time per channel of 25 milliseconds. Approximately 2 milliseconds is required for obtaining the next frequency code for a selected state and frequency group, loading the synthesizer and running the squelch check routine, and during the remaining 23 milliseconds of the scan time per channel the microprocessor executes a wait loop during which system transients die down.

In the squelch check routine shown in the flowchart of FIG. 4, microprocessor 24 takes 32 consecutive samples from its internal A/D converter. The internal A/D converter has a conversion time of 30 microseconds, thus samples are taken over an interval of 0.96 milliseconds. The 32 samples are added together, and then, in step 152, the accumulated total is divided by 32 by shifting the digital value to the right by 5 bits. The value of the squelch control pot 44 is sampled in step 154 and compared, in step 156, with the value determined in step 152. The presence or absence of a signal is determined according to a hysteresis curve having upper and lower set points equal to the value of the sample from the squelch control pot ±15. With A/D resolution of 8 bits and an A/D reference voltage of 5 volts, this level of hysteresis corresponds to approximately ±30 millivolts. If a signal is determined to be present, the microprocessor resets the MUTE line, and conversely, if no signal is present, the microprocessor sets the MUTE line. In either event, program control returns to the main program.

The status of the MUTE line is also used by the main program to determine whether or not a signal is present. The microprocessor branches from step 108 back to step 100 if a signal is not present on the currently received channel, and otherwise proceeds to step 110. As indicated earlier, the receiver audio is muted if no signal is present, whereas the audio output circuit is enabled to audibly reproduce an audio signal if one is found on the current channel.

If the squelch is released, a 50-millisecond delay timer is set in step 110 before the squelch is checked again, which occurs in step 112. This time, if there is a signal on the current channel, the microprocessor branches from step 114 back to step 110 to reset the delay timer for another 50 milliseconds. If no signal is currently detected, program control proceeds to decision step 116 wherein the delay timer is checked to see if it has timed out. If the timer has timed out, progrm control returns to step 100 for resumption of frequency scanning. If not, the squelch check routine is again executed in step 112 to recheck for a signal on the current channel. The delay routine just described allows for momentary lapses in transmissions which occur during normal channel usage.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected. It should also be understood that, while geographical regions have been described in terms of states, it is also contemplated that such regions might be regions of individual states, such as individual counties or groups of counties, or regions of other countries or continents.

We claim:

1. A scanning radio receiver, comprising:
   a frequency synthesizer;
   first memory means for storing digital codes for the frequencies allocated to a particular service in each of a plurality of geographical regions;
   second memory means for storing identification data for each of said geographical regions;
   first switch means for selecting a geographical region operable in a first state to sequentially scan said identification data and in a second state to terminate the scan upon reaching a selected geographical region;
   a control circuit, said control circuit having means responsive to said first switch means in said state position for sequentially reading the digital codes for the frequencies allocated to a particular service for a selected geographical region, and means for sequentially loading said frequency synthesizer with said digital codes read from said first memory means;
   an RF amplifier;
   a mixer connected to respective outputs of said RF amplifier and said frequency synthesizer;
   an IF amplifier-detector connected to said mixer;
   an audio output circuit connected to said IF amplifier-detector;
   squelch circuit means for disabling said audio output circuit in the absence of a detected signal on any one of the frequencies corresponding to said sequentially read digital codes; and
   display means having means responsive to said first switch means for displaying a two character code corresponding to said geographical region selected.

2. The scanning radio receiver of claim 1 wherein said display means is a two character, 16-segment per character, alphanumeric display.

3. The scanning radio receiver of claim 2 wherein said two character display provides a visual alphanumeric indication of the geographical region selected by said first switch means.

4. A scanning radio receiver, comprising:
   a frequency synthesizer;
   memory means for storing digital codes for the frequencies allocated to a particular service in each of a plurality of geographical regions, characterized by a frequency matrix having stored indicia associated with each of said regions to indicate whether a particular frequency is allocateed to a geographical region;
   first switch means for selectinng a geographical region;

a control circuit, said control circuit having means responsive to said first switch means for sequentially reading the digital codes for the frequencies allocated to a particular service for a selected geographical region, and means for sequentially loading said frequency synthesizer with said digital codes read from said memory means;

an RF amplifier;

a mixer connected to respective outputs of said RF amplifier and said frequency synthesizer;

an IF amplifier-detector connected to said mixer;

an audio output circuit connected to said IF amplifier-detector;

squelch circuit means for disabling said audio output circuit in the absence of a detected signal on any one of the frequencies corresponding to said sequentially read digital codes; and display means having means resonsive to said first switch means for displaying a two character code corresponding to said geographical region selected.

5. The scanning radio receiver of claim 4 wherein said display means is a two character, 16-segment per character, alphanumeric display.

6. The scanning radio receiver of claim 5 wherein said two character display provides a visual alphanumeric indication of the geographical region selected by said first switch means.

* * * * *